(12) United States Patent
Bancel

(10) Patent No.: US 9,021,316 B2
(45) Date of Patent: Apr. 28, 2015

(54) REGISTER PROTECTED AGAINST FAULT ATTACKS

(71) Applicant: STMicroelectronics (Rousset) SAS, Rousset (FR)

(72) Inventor: Frederic Bancel, Senas (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 133 days.

(21) Appl. No.: 13/789,424

(22) Filed: Mar. 7, 2013

(65) Prior Publication Data

US 2013/0275817 A1    Oct. 17, 2013

(30) Foreign Application Priority Data

Apr. 12, 2012   (FR) ...................................... 12 53354

(51) Int. Cl.
*G06F 11/00* (2006.01)
*G06F 11/07* (2006.01)
*G11C 7/24* (2006.01)
*G11C 11/412* (2006.01)

(52) U.S. Cl.
CPC .............. *G06F 11/0751* (2013.01); *G11C 7/24* (2013.01); *G11C 11/4125* (2013.01)

(58) Field of Classification Search
USPC ......................................................... 714/54
See application file for complete search history.

(56) References Cited

U.S. PATENT DOCUMENTS

| 4,056,845 | A  | * | 11/1977 | Churchill, Jr. ................ 711/127 |
| 7,232,983 | B2 | * | 6/2007  | Garbe et al. ................ 250/214 R |
| 2004/0044943 | A1 | * | 3/2004 | Jacquet et al. ................ 714/763 |
| 2006/0011816 | A1 | * | 1/2006 | Garbe et al. ................ 250/214 R |
| 2009/0073759 | A1 | * | 3/2009 | Wuidart ...................... 365/185.2 |
| 2011/0267094 | A1 | * | 11/2011 | La Rosa ................... 324/764.01 |

FOREIGN PATENT DOCUMENTS

| FR | 0388526 A2 | 9/1990 |
| FR | 2923923 A1 | 5/2009 |

OTHER PUBLICATIONS

French Search Report, dated Feb. 14, 2013 for French application No. 1253354, 8 pages.

\* cited by examiner

*Primary Examiner* — Kamini Patel
(74) *Attorney, Agent, or Firm* — Seed IP Law Group PLLC

(57) ABSTRACT

A circuit and method of detecting a fault attack in a circuit includes a plurality of registers each identified by an address. The method includes storing in a memory the address present on an address bus during a write operation to one of said registers. In response to a first alert signal indicating that the data stored by a first of said registers has been modified, comparing the address identifying said first register with said stored address.

14 Claims, 3 Drawing Sheets

REGISTER PROTECTED AGAINST FAULT ATTACKS

BACKGROUND

1. Technical Field

The present disclosure relates to a method and circuitry for detecting a fault attack, and in particular to a method and circuitry for detecting a fault attack relating to at least one register.

2. Description of the Related Art

Integrated circuits may comprise circuitry that is considered sensitive in view of the security of the data it manipulates, such as authentication keys, signatures, etc., or in the algorithms it uses, such as encryption or decryption algorithms. Such information is desired to be kept secret, meaning that it should not be communicated to, or otherwise be detectable by, third parties or unauthorized circuits.

A common process for pirating information manipulated by integrated circuits consists in detecting the zones of the circuit that are used during the processing of that information. For this, the integrated circuit is activated or placed in a functional environment, and data is introduced at an input. While the data is being processed, the surface of integrated circuit is swept by a laser to inject faults in the functioning of the circuit. By analyzing in parallel the outputs of the circuit, this enables the zones of the circuit that process the data to be determined. Having localized these zones, the pirate can concentrate attacks on these zones in order to determine the secret data being processed.

During the processing of sensitive data by an integrated circuit, the data is temporarily stored in registers, and such registers are particularly vulnerable to fault analysis attacks. In order to protect registers against a fault attack, one option would be to replace each register by two identical registers with the same address, and to continuously compare the data stored in these registers. However, such a solution is not effective in many situations. For example a fault injected on the common address bus or on a common reset path can not be detected, because it will affect the identical registers in the same way.

Therefore, there is a need for an improved method and circuit that is more effective in detecting a fault attack against a register.

BRIEF SUMMARY

It is an aim of the embodiments described herein to at least partially address one or more disadvantages in the prior art.

According to one aspect, there is provided a method of detecting a fault attack in a circuit comprising a plurality of registers each identified by an address, the method comprising: storing in a memory the address present on an address bus during a write operation to one of said registers; in response to a first alert signal indicating that the data stored by a first of said registers has been modified, comparing the address identifying said first register with said stored address.

According to one embodiment, the method further comprises generating an error signal if the address identifying said first register does not match said stored address.

According to another embodiment, the method further comprises detecting when the data stored by said first register is modified by comparing, by a comparator, a value of the data stored by said first register with a value stored by a reference register.

According to another embodiment, the method comprises, prior to comparing said value of the data stored by said first register with a value stored by said reference register, initiating the value stored by said reference register based on the data stored by said first register.

According to another embodiment, the method further comprises updating the value stored by said reference register in response to a detected modification of the data stored by said first register.

According to another embodiment, the method further comprises: in response to a second alert signal indicating that the data stored by a second of said registers has been modified, generating an error signal if said second alert signal corresponds to the same register operation as said first alert signal, and if not, comparing the address identifying said second register with said stored address.

According to another embodiment, storing said address present on an address bus is performed based on a control signal indicating when the address present on the address bus corresponds to a write operation.

According to another embodiment, the value of the data stored by said first register and the value stored by said reference register are signatures.

According to another embodiment, at least one register is further coupled to a data bus, and the method further comprises, in response to a write operation to the first register, comparing, by the fault detection circuitry, data present on the data bus during the write operation with the data stored by said first register in response to the write operation.

According to a further aspect, there is provided fault detection circuitry for detecting the presence of a fault in at least one register coupled to an address bus, the fault detection circuitry being adapted to receive a first alert signal indicating that the data stored by a first of said at least one registers has been modified, wherein in response to said first alert signal, the fault detection circuitry is configured to compare an address present on said address bus during a previous write operation with an address of said first register.

According to one embodiment, the fault detection circuitry is further adapted to receive a second alert signal indicating that the data stored by a second of said at least one registers has been modified, wherein the fault detection circuitry is configured to compare an address present on said address bus during a previous write operation with an address of said second register.

According to another embodiment, the fault detection circuitry comprises a first comparator adapted to generate said first alert signal by comparing a value of the data stored by said first register with a value stored by a reference register.

According to another embodiment, the fault detection circuitry further comprises circuitry adapted to update the value stored by said reference register based on the data stored by the first register in response to the detection of a modification of the data stored by said first register.

According to a further aspect, there is provided circuitry comprising: the above fault detection circuitry; a processing device coupled to said address bus and to said data bus; and said at least one register coupled to said address bus and to said data bus.

According to a further aspect, there is provided a cryptographic device comprising the above circuitry.

BRIEF DESCRIPTION OF THE SEVERAL VIEWS OF THE DRAWINGS

The foregoing and other purposes, features, aspects and advantages of embodiments of the invention will become apparent from the following detailed description of embodiments, given by way of illustration and not limitation with reference to the accompanying drawings. Non-limiting and non-exhaustive embodiments are described with reference to the following drawings, wherein like labels refer to like parts throughout the various views unless otherwise specified. One or more embodiments are described hereinafter with reference to the accompanying drawings in which.

DETAILED DESCRIPTION

Figure 1:
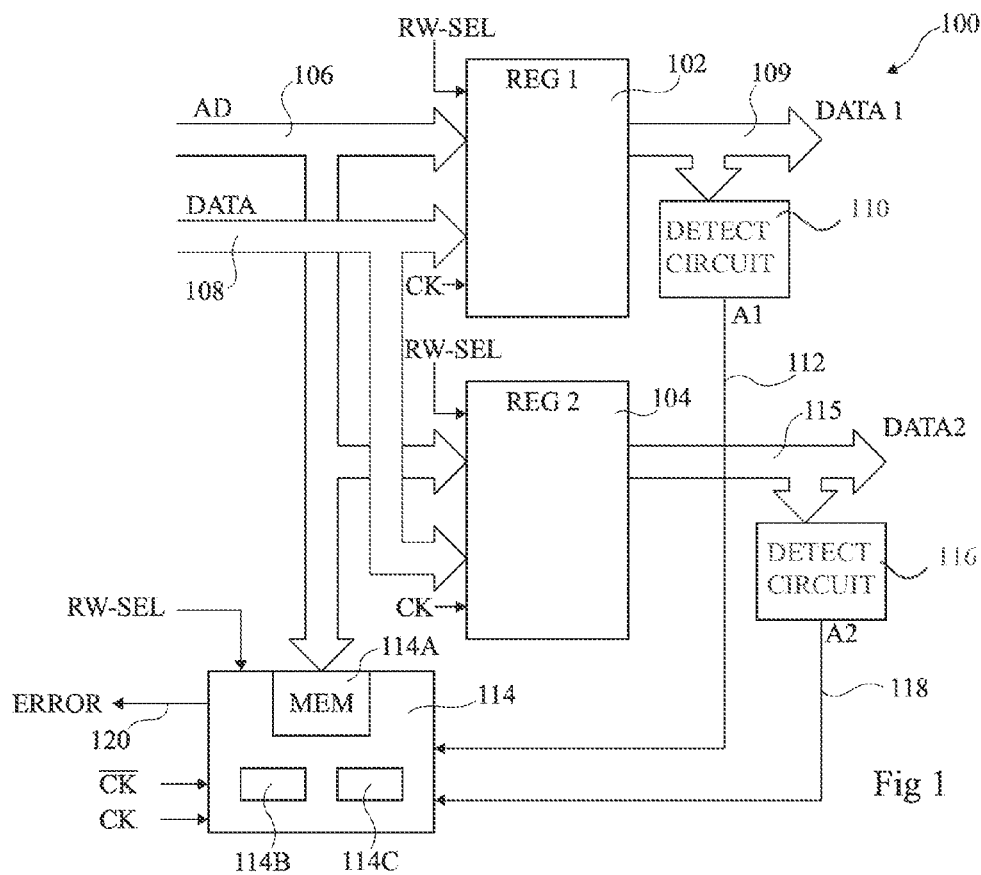
FIG. 1 schematically illustrates register circuitry comprising fault detection circuitry according to an example embodiment.

FIG. 1 schematically illustrates circuitry 100 comprising two registers 102 (REG1) and 104 (REG2), each coupled to an address bus 106 (AD), and to a data bus 108 (DATA).

Register 102 comprises a data output bus 109 coupled to a detector circuit 110, configured to detect a change in the data DATA1 stored by the register 102. An alert signal Al is provided to a fault detection block 114 on an output line 112 of the detector circuit 110.

Similarly, register 104 comprises a data output bus 115 coupled to a detector circuit 116, configured to detect a change in the data DATA2 stored by the register 104. An alert signal A2 is provided to the fault detection block 114 on an output line 118 of the detector circuit 116.

The registers 102, 104 are each addressable memory devices that store a number of bits of data, such as for example 32, 64 or 128 bits. For example, the registers 102, 104 are based on volatile memory cells such as SRAM (static random access memory) cells, although other types of memory cells could be used, such as flip-flops. While two registers 102, 104 are illustrated in FIG. 1, there could be any number of registers. Each register 102, 104 is associated with an identifying address. The number of bits of the address will depend for example on the number of registers, but could be 8 or 16 bits as an example.

In addition to the alert signals A1 and A2 on lines 112 and 118, the fault detection block 114 is coupled to the address bus 106. Furthermore, the fault detection block 114 and each of the registers 102, 104 for example receive a common read/write selection signal (RW-SEL) and a common clock signal (CK) on corresponding input lines. The fault detection block 114 additionally receives an inverted version $\overline{CK}$ of the clock signal.

The fault detection block 114 for example comprises a memory 114A storing addresses present on the address bus 106, and memories 114B and 114C, which store respectively the address of register 102 and the address of register 104.

The fault detection block 114 comprises an output line 120 providing an error signal in the case that the presence of a fault is detected in one of the registers 102, 104, on the address bus 106 or on the read/write selection signal, as will be described in more detail below. While not illustrated in FIG. 1, the error signal on line 120 can be used to trigger one or more fault attack counter measures, such as resetting the integrated circuit chip in which the circuitry 100 is formed, and/or incrementing a counter such that the integrated circuit is rendered inactive after a certain number of faults have been detected.

Operation of the fault detection block 114 will now be described in more detail with reference to the flow diagram of FIG. 2A.

The fault detection block 114 for example continually stores in the memory 114A the latest address present on the address bus 106 corresponding to write operations, and optionally also stores one or more previous addresses. In particular, the read/write selection signal RW-SEL indicates whether a current operation on the buses 106, 108 is a read or write operation, and in the case of a write operation, the memory 114A is controlled to store the address, for example on the rising edges of the inverse clock signal $\overline{CK}$.

At a step 202, the detection of a change in the stored data of either or both of the registers 102, 104 triggers the fault verification process. Such a change of the stored data is indicated by either or both of the alert signals A1, A2 being asserted, for example to a logic high level.

In the subsequent step 204, depending on whether the change of data is in the register REG1, in the register REG2, or in both of the registers REG1 and REG2, the method proceeds to one of three subsequent steps. In particular, if the data change was only in register REG1 102, as indicated by only the alert signal A1 being asserted, the next step is 206. Alternatively, if the data change was only in register REG2 104, as indicated by only the alert signal A2 being asserted, the next step is 208. If data changed was in both of the registers 102, 104, as indicated by both of the alert signals A1, A2 going high during a same register operation, the next step is 210.

In step 206, the last write address stored in the memory 114A is compared to the address of register 102 stored in memory 114B. If the data change in the register REG1 was the result of a normal write operation, the addresses should match, and in this case the verification ends, and the method for example returns to the initial step 202 when a subsequent data change is detected. However, if these addresses do not match, the next step is 210, in which the error signal is asserted in line 120 of the fault detection block 114.

Similarly, in step 208, the last write address stored in the memory 114A is compared to the address of register 104 stored in memory 114C. If the data change in the register REG2 104 was the result of a normal write operation, the addresses should match, and in this case the verification ends, and the method for example returns to the initial step 202 when a subsequent data change is detected. However, if the addresses do not match, the next step is 210, in which the error signal is asserted in line 120 of the fault detection block 114.

If a data change is detected in both of the registers REG1 and REG2, the method for example goes directly from step 204 to step 210, and the error signal is asserted.

Figure 2A:
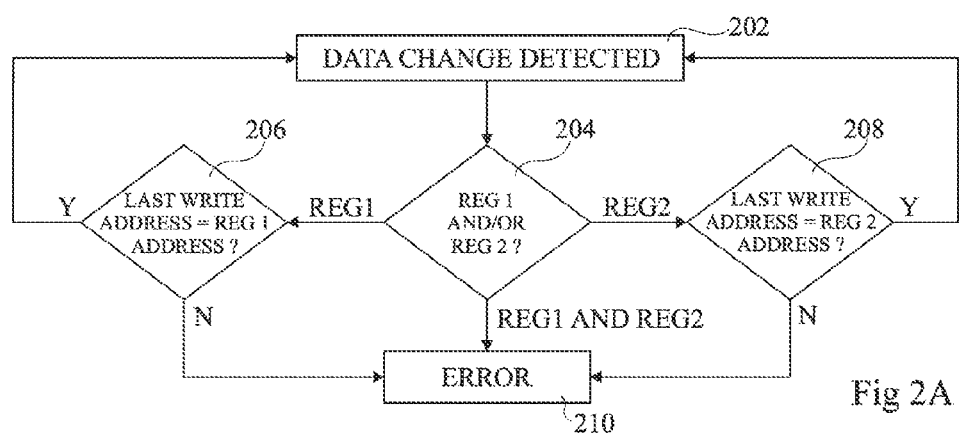
FIG. 2A is a flow diagram illustrating steps in a method of protecting a register against a fault attack based on the circuitry of FIG. 1 according to an example embodiment.

It will be apparent to those skilled in the art that the flow diagram of FIG. 2A, which corresponds to the case in which two registers are present and both of these registers are protected, could be adapted such that only one of the registers is protected, or such that there are more than two registers present, and more than two of these registers are protected. In the case that there are more than two alert signals, an error is for example generated if two or more of the alert signals are asserted during the same register operation.

Figure 2B:
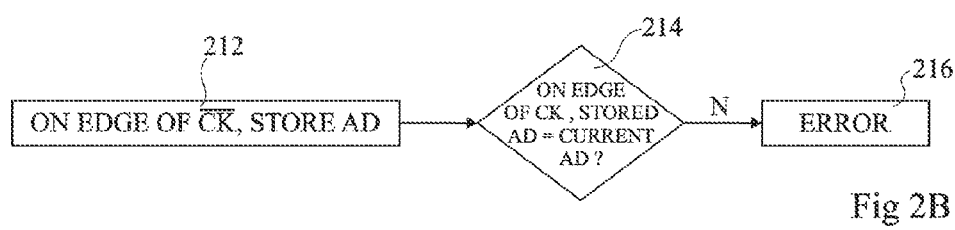
FIG. 2B is a flow diagram illustrating steps in a method of protecting a register against a fault attack based on the circuitry of FIG. 1 according to an alternative embodiment.

FIG. 2B is a flow diagram illustrating an example of a further method implemented by the fault detection block 114 of FIG. 1 for protecting the registers 102, 104 against a fault attack.

In a step 212, the address present on the address bus AD 106 is for example stored on a significant edge of the inverse clock signal $\overline{CK}$, which could be a falling or rising edge. For example, the address is stored on the rising edge of signal $\overline{CK}$, which corresponds to a falling edge of signal CK.

In a subsequent step 214, on a significant edge of the clock signal CK, the stored address is compared to the current address on the address bus 106. For example, step 214 is performed on a rising edge of clock signal CK, which corresponds to a falling edge of clock signal $\overline{CK}$. If there is a mismatch, the next step is 216, in which the error signal on line 120 is asserted.

Figure 3:
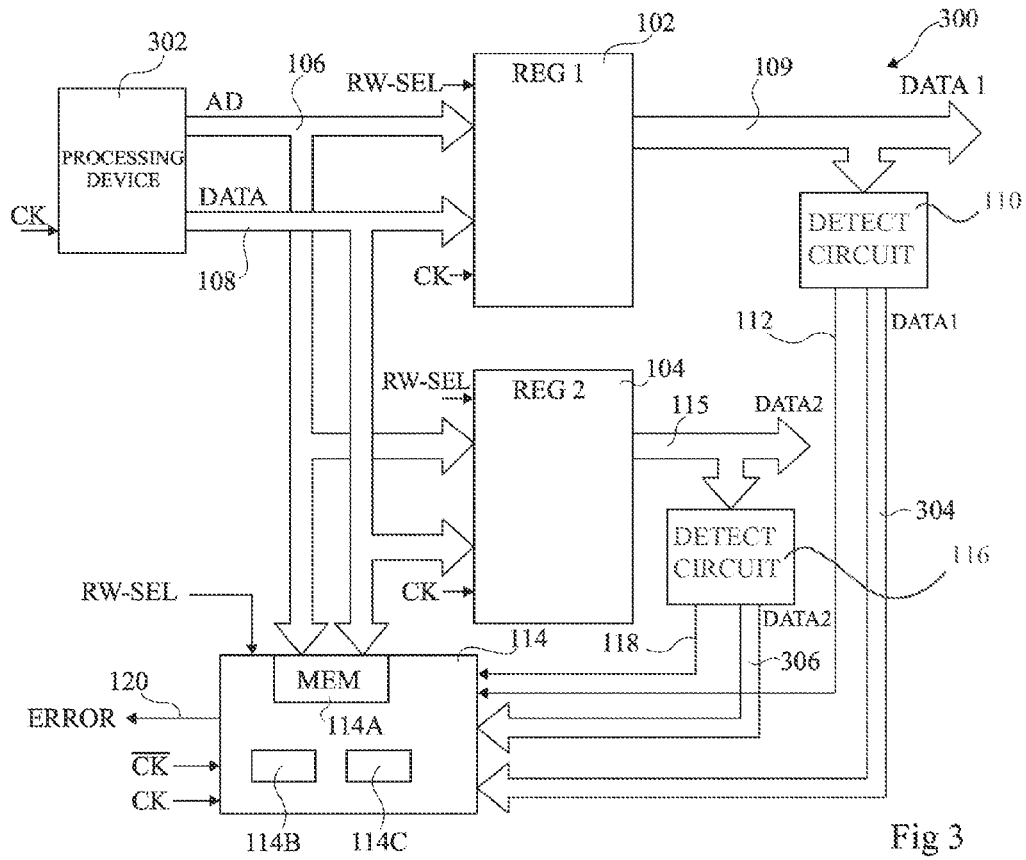
FIG. 3 schematically illustrates register circuitry comprising fault detection circuitry according to a further example embodiment.

FIG. 3 schematically illustrates circuitry 300 according to an alternative embodiment to that of FIG. 1. Many elements of the circuitry 300 are the same as elements of the circuitry 100, and these elements have been labeled with like reference numerals and will not be described again in detail.

In the example of FIG. 3, a processing device 302 supplies the address and data signals on the buses 106 and 108. The processing device 302 is for example comprised of one or more processors, and is clocked by clock signal CK, for example the same clock signal as used for clocking the registers 102, 104.

In addition to providing the alert signals A1 and A2 on lines 112 and 118 respectively to the fault detection block 114, the detector circuits 110 and 116 each provide the data signals from their respective registers. In particular, the data signal DATA1 on the output bus 109 of register 102 is provided by detector circuit 110 to the fault detection circuitry 114 on a bus 304, and the data signal DATA2 on the output bus 115 of register 104 is provided by detector circuit 116 to the fault detection circuitry 114 on a bus 306.

The fault detection block 114 of FIG. 3 additionally receives the data signal DATA of the data bus 108. In particular, the data bus 108 is coupled to the memory 114A of block 114. The data signal DATA is for example stored by the memory 114A at the same time as the address AD, which is for example on every falling edge of the clock signal CK when the register operation is a write operation.

Operation of the fault detection block 114 of FIG. 3 is for example similar to that of FIG. 1, and in particular, it for example implements the steps of the flow diagrams of FIGS. 2A and 2B. For example, the verification of FIG. 2B is performed for both the address signal AD on address bus 106, and the data signal DATA on the data bus 108.

Additionally, the fault detection block 114 for example verifies the data written to one of the registers 102, 104 in response to a write operation, as will now be described in more detail with reference to FIG. 4.

Figure 4:
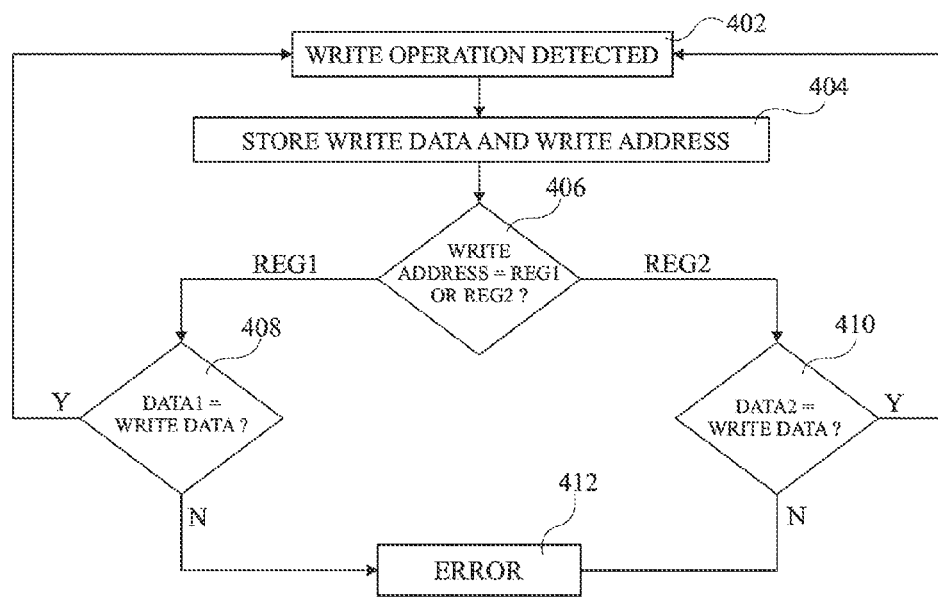
FIG. 4 is a flow diagram illustrating steps in a method of protecting a register against a fault attack based on the circuitry of FIG. 3.

FIG. 4 is a flow diagram illustrating steps in a method of verifying the data written during a write operation.

In an initial step 402, the fault detection block 114 detects a write operation. In particular, the read/write selection signal RW-SEL indicates that a current operation is a write operation.

In response, the next step is 404, in which the write address and write data present on buses 106 and 108 are stored by the memory 114A.

In a subsequent step 406, it is determined whether the write address corresponds to the address of register REG1 or of register REG2. In the former case, the next step is 408, and in the latter case, the next step is 410.

In step 408, the data signal DATA1 present on bus 304 is compared to the stored write data. If they match, the method returns to step 402 when a subsequent write operation is detected. If they do not match, the next step is 412, in which the error signal is generated.

In step 410, the data signal DATA2 present on bus 306 is compared to the stored write data. If they match, the method returns to step 402 when a subsequent write operation is detected. If they do not match, the next step is 412, in which the error signal is generated.

Figure 5:
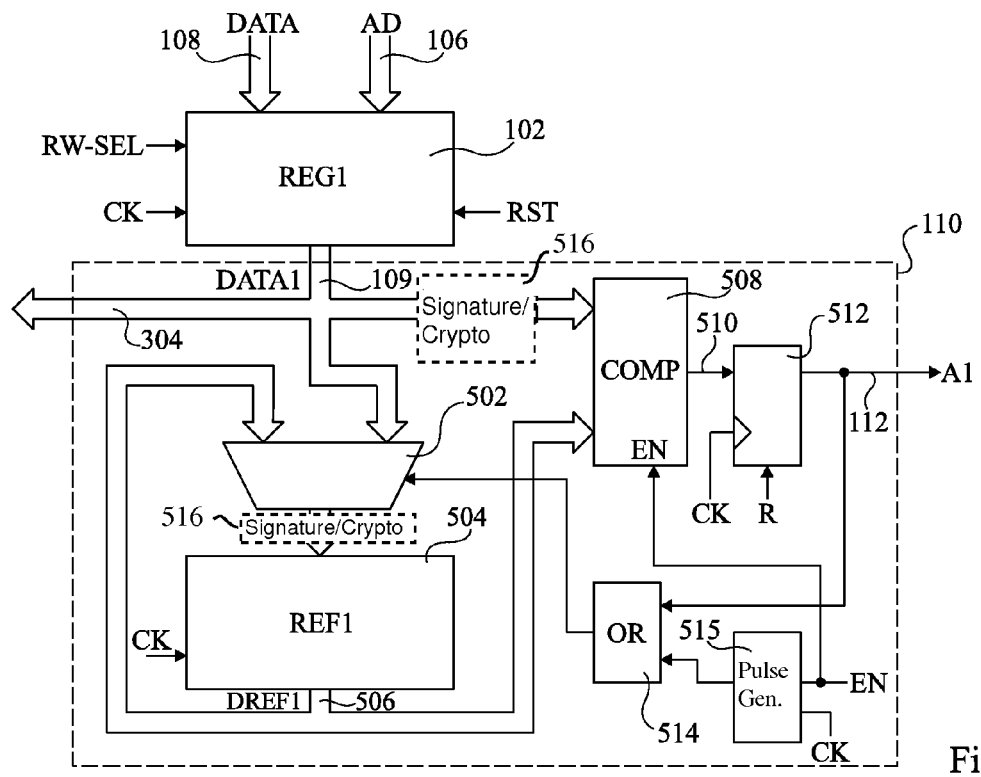
FIG. 5 schematically illustrates a register and a detector circuit of the circuitry of FIGS. 1 and 3 in more detail according to an example embodiment.

FIG. 5 schematically illustrates the register 102 and the detector circuit 110 of FIGS. 1 and 3 in more detail according to an example embodiment. The register 104 and detector circuit 116 are for example implemented in the same way.

As illustrated in FIG. 5, in addition to the clock and read/write selection signals CK and RW-SEL, the register 102 also for example receives a reset signal RST.

The data output of register 102 on bus 109 is provided to one input of a multiplexer 502 of the detector circuit 110. The output of multiplexer 502 is coupled to a reference register (REF1) 504. The reference register 504 is clocked by the clock signal CK, and provides an output on a bus 506 to a further input of multiplexer 502.

The outputs of the register 102 and reference register 504 on buses 109 and 506 respectively are also coupled to the inputs of a comparator 508, which compares these signals, and asserts a signal on its output line 510 if these signals do not match. The output line 510 is coupled to the input of a D-type flip-flop 512, which clocks the output of the comparator 508 to provide the alert signal A1 on line 112. Flip-flop 512 is for example clocked by the clock signal CK, and is controlled by a reset signal R.

The alert signal A1 on line 112 is also coupled to one input of a two-input OR gate 514, which receives at its second input the output of a pulse generator device 515. Device 515 receives at an input an enable signal EN, and is clocked by the signal CK. Device 515 for example generates a pulse on each rising edge of the enable signal EN. The output of OR gate 514 controls which of the inputs of multiplexer 502 is selected. The enable signal EN is also for example coupled to an enable input of the comparator 508.

In operation, after activation of the enable signal EN, the data of register 102 is stored to the reference register 504. The comparator 508 thus compares two equal data values, and the alert signal is not asserted. On subsequent cycles, assuming the data stored by registers 102 and 504 remain the same, the multiplexer 502 simply routes the data of the reference register 504 back to its input, such that its value does not change. However, any change in the data stored by register 102 or in the data stored by register 504 will cause the output of comparator 508 to be asserted. In response, on the next clock cycle, the alert signal A1 is asserted on line 112, and the output of OR gate 514 goes high. This controls the multiplexer 502 to select again the output of register 102, such that the reference register 504 is updated with the data from register 102.

In some embodiments, the reference register 504 stores the data of register 102, and the comparator 508 compares the data of register 102 with the data copied to register 504. In alternative embodiments, the reference register 504 could store a signature generated based on the data from the data register 102. In this case, a signature generation algorithm is for example implemented on the connection between the output of multiplexer 502 and the input of reference register 504, as indicated by a dashed signature circuits 516 in FIG. 5. Furthermore, the same signature generation algorithm is for example applied to the data bus 109 at the input of comparator 508 as indicated by a further dashed line in FIG. 5. For example, the signature generation algorithm could be a hash function or other function for reducing the number of data bits while still ensuring that each of the original data bits affects the signature value.

An example of operation of the circuitry of FIG. 5 in combination with the circuitry 300 of FIG. 3 will now be described in more detail with reference to the timing diagram of FIG. 6.

Figure 6:
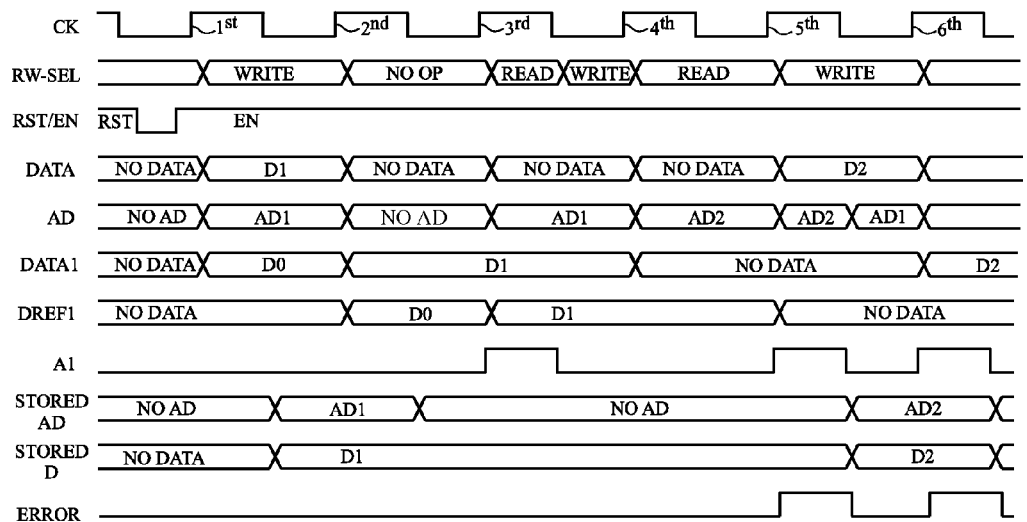
FIG. 6 is a timing diagram illustrating signals of circuitry of FIG. 3 according to an example embodiment.

FIG. 6 illustrates examples of the clock signal CK, the read/write signal RW-SEL, the reset signal RST and enable signal EN, which for ease of illustration are shown superposed in a same line, the data signal DATA and address signal AD on buses 108 and 106, the data stored by the registers REG1 102 and REF1 504, the alert signal A1, the data stored by the memory 114A, and the error signal generated by the fault detection circuitry 114.

In the example of FIG. 6, five consecutive cycles are illustrated, corresponding to a write operation, a no-operation cycle, two read operations and then a write operation.

Initially, the reset signal RST is asserted, and thus the data in the registers is reset. Furthermore, no data or address is present on the address and data buses 106, 108. The reset signal RST goes low before the first operation, and the enable signal EN goes high, thereby activating the verification mechanism.

The first operation is a write operation directed to an address AD1, which is the address of register 102, and data D1 is present on the data bus 108. The address AD1 and data D1 appear on the buses 106, 108 shortly after the first rising edge of the clock signal CK. On the first falling edge of the clock signal CK, the address AD1 and data D1 are stored by the memory 114A.

Shortly after the second rising edge of the clock signal CK shown in FIG. 6, the data stored in the reference register REF1 changes to D0, corresponding to the no data value stored in register REG1 102.

Shortly after the second rising edge of the clock signal CK shown in FIG. 6, the data stored by the register 102 goes from D0 to D1. This causes the alert signal A1 to go high shortly after the third rising edge of the clock signal CK, because the data of register 102 and of register 504 are no longer identical.

In response to the alert signal A1, the fault detection block 114 compares the value of the address AD1 stored by the memory 114A on the second rising clock edge with the known address of register 102, and because these addresses correspond, no error signal is generated. Instead, the reset signal R of the flip-flop 512 is for example asserted by the fault detection block 114, thereby bringing the alert signal low shortly after the falling edge of the third falling edge of the alert signal A1. Furthermore, the alert signal A1 causes the reference register 504 to be updated with the data signal from register 102. Additionally, after this comparison step, the address value stored by the memory 114A is for example reset to a non-valid address, indicated as "NO AD" in FIG. 6. In this way, a subsequent attack against the register REG1 can be detected.

During the second cycle, no operation is performed, and thus no data is provided on the address and data buses 106, 108.

During the third cycle, a read operation of register REG1 is performed. Thus no data is present on the data bus 108 during this operation, and the memory 114A is for example not configured to store the address or data on this cycle. However, during this read operation, the corresponding read/write selection signal RW-SEL is asserted shortly after the third rising edge of clock CK, but shortly after the third falling edge of the clock CK, a fault is injected into this control signal changing the read instruction into a write instruction. In view of this fault, on the fourth rising edge of the clock signal CK, the "no data" value present on the data bus 108 is written to the first register 102. This data modification causes the alert signal A1 to rise shortly after the fifth rising edge of the clock signal CK. In response, the fault detection block 114 verifies the stored address that was present on the address bus 106 during the third operation, and finds the address to incorrectly correspond to a no address signal, because the previous operation was not a write operation. Thus the error signal is asserted. While not illustrated in FIG. 6, the error signal for example causes a counter to be incremented, which will cause the device 300 to be reset once a certain count value is reached.

A fourth operation is a read operation of the second register 104, which is assumed to proceed normally.

A fifth operation is a write operation to the second register 104, but during this write cycle, a fault is injected onto the address bus 106, after the fifth falling edge of the clock signal CK. Thus, whereas the data D2 of this write operation should have been stored in the register 104, it is stored in the register 102. Thus at the sixth rising edge of the clock signal CK, the alert signal A1 is again asserted. In response, the fault detection block 114 compares the address AD2, which was stored by the memory 114A on the fifth falling edge of the clock signal CK, with the address of register 102. These addresses do not match and thus the error signal is asserted.

It will be noted that if the fault in the address signal AD during the fifth register operation occurred before the fifth falling edge of the clock signal CK, such a fault would for example be detected by the method described with reference to FIG. 2B, because there would be a change of the address signal between the fifth falling edge and the sixth rising edge of the clock signal CK.

Of course, while not illustrated in FIG. 6, any change in the data stored by the register REG1 or REF1 during a non-write operation will cause the error signal to be asserted, due to the invalid stored address.

Figure 7:
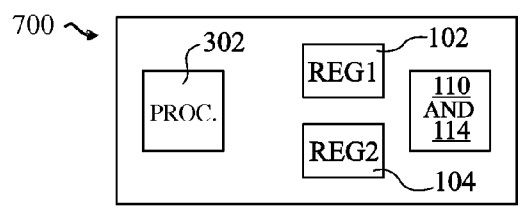
FIG. 7 schematically illustrates an electronic device comprising a fault detection circuitry according to an example embodiment.

FIG. 7 illustrates an electronic device 700 comprising a processing device 302, the registers 102 and 104, and a block comprising the detector circuit 110 and the fault detection block 114 as described herein.

The device 700 is for example any cryptographic device comprising a plurality of addressed registers. For example, the device 700 is an IC (integrated circuit) card, an IC card reader, or other device that manipulates sensitive data.

An advantage of embodiments described herein is that, by generating an alert based on any change of the data stored by a register, and then verifying that address of a previous write operation matches the address of that register, a broad range of fault attacks may be detected. In particular, a change in the data may be caused by a fault injected on an address bus or on a read/write selection signal. Advantageously, by detecting only a change in the data of a corresponding register, the detector circuit can operate using a reference register that does not share a common input data bus, address bus, or read/write selection signal with the register to be protected. Therefore, it is not susceptible to faults occurring on these input buses/lines. Furthermore, by further comparing the data stored in the register and the data present on the data bus during the write operation, a fault injected on the data bus may also be detected.

Furthermore, by verifying that the address and data present on the address and data buses remain constant between two subsequent edges of a clock signal, the injection of a fault during at least part of an operation can be detected.

Having thus described at least one illustrative embodiment, various alterations, modifications and improvements will readily occur to those skilled in the art.

For example, it will be apparent to those skilled in the art that each time an event is described as occurring on a rising or falling edge, the inverse could be true.

Furthermore, it will be apparent to those skilled in that the time diagram of FIG. 6 is merely one example, and there are many other possibilities for the timing of the various signals that are represented.

Furthermore, as it will be apparent to those skilled in the art, the various features described in relation with the various embodiments could be combined in any combination.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of detecting a fault attack in a circuit having a plurality of registers, each register identified by an address, the method comprising:
   storing in a memory an address present on an address bus during a write operation to one register of said plurality of registers;
   comparing data stored in a first register of said plurality of registers to a reference value to determine if the data stored in the first register has been modified;
   asserting a first alert signal if the comparison of data stored in the first register to the reference value indicates the data stored in the first register has been modified;
   comparing, in response to the assertion of the first alert signal, an address identifying said first register with said stored address;
   generating a first error signal if the comparison of the address identifying said first register to said stored address indicates the address identifying said first register is different from said stored address;
   comparing data stored in a second register of said plurality of registers to a second reference value to determine if the data stored in the second register has been modified; and
   upon a determination that the first register has been modified during the write operation and the second register has been modified during the write operation, generating a second error signal.

2. The method of claim 1, wherein the reference value is stored in a reference register.

3. The method of claim 2, further comprising:
   initializing, prior to comparing said value of the data stored in said first register with the value stored in said reference register, the value stored in said reference register based on the data stored in said first register.

4. The method of claim 2, further comprising:
   updating the value stored in said reference register in response to a detected modification of the data stored in said first register.

5. The method of claim 1 wherein storing said address present on the address bus is performed based on a control signal that indicates when the address present on the address bus corresponds to a write operation.

6. The method of claim 5 wherein the value of the data stored in said first register and the value stored in said reference register are signatures.

7. The method of claim 1 wherein at least one register of the plurality of registers is further coupled to a data bus, the method further comprising:
   comparing in fault detection circuitry, in response to a write operation to the first register, data present on the data bus during the write operation with the data stored in said first register in response to the write operation.

8. Fault detection circuitry configured to detect a presence of a fault in a registers coupled to an address bus, the fault detection circuitry comprising:
   a first terminal configured to receive a first alert signal that is generated when data stored in a first register has been modified;
   a comparison circuit configured to, in response to the generation of said first alert signal, compare an address present on said address bus during a first write operation with an address of said first register;
   an output line configured to pass a first error signal if the comparison of the address present on said address bus during the first write operation is different from the address of said first register;
   a second terminal configured to receive a second alert signal that is generated when data stored in a second register has been modified, wherein the comparison circuit is further configured, in response to the generation of said second alert signal, to compare the address present on said address bus during the first write operation with an address of said second register, and wherein the output line is further configured to pass a second error signal upon a determination that the first register has been modified during the first write operation and the second register has been modified during the first write operation.

9. The fault detection circuitry of claim 8, comprising:
   a comparator configured to generate said first alert signal by comparing a value of the data stored in said first register with a value stored in a reference register.

10. The fault detection circuitry of claim 9, wherein the comparison circuit is configured to update the value stored in said reference register based on the data stored in the first register in response to detection of a modification of the data stored in said first register.

11. A circuit, comprising:
   an address bus;
   a data bus;
   a first register coupled to said address bus and said data bus;
   a second register coupled to said address bus and said data bus;
   a reference register;
   fault detection circuitry configured to detect a fault in the circuit, the fault detection circuitry adapted to:
      generate a first alert signal when data stored in the first register has been modified;
      compare, in response to the generation of the first alert signal, an address present on said address bus during a first write operation with an address of said first register;

assert a first error signal if the comparison of the address present on said address bus during the first write operation is different from the address of said first register;

generate a second alert signal when data stored in the second register has been modified;

compare, in response to the generation of the second alert signal, the address present on said address bus during the first write operation with an address of said second register; and assert a second error signal upon a determination that the first register and the second register have been modified during the first write operation;

a cryptographic circuit coupled to the first register via the data bus; and a processing device coupled to said address bus and to said data bus.

12. The circuit of claim 11, further comprising:

a comparator configured to compare data stored in the first register with data stored in the reference register.

13. The circuit of claim 12 wherein data stored in the first register and data stored in the reference register are signatures.

14. The circuit of claim 11 wherein the cryptographic circuit is configured to process data that is stored in the first register.

* * * * *